United States Patent
Ochiai et al.

(10) Patent No.: US 7,342,353 B2
(45) Date of Patent: Mar. 11, 2008

(54) DISPLAY DEVICE WITH INSULATION FILM AND CONDUCTIVE LAYERS ARRANGED IN PERIPHERY OF THE SUBSTRATE

(75) Inventors: Takahiro Ochiai, Chiba (JP); Kikuo Ono, Mobara (JP); Ryutaro Oke, Mobara (JP)

(73) Assignee: Hitachi Displays, Ltd., Chiba-ken (JP)

( * ) Notice: Subject to any disclaimer, the term of this patent is extended or adjusted under 35 U.S.C. 154(b) by 189 days.

(21) Appl. No.: 10/813,087

(22) Filed: Mar. 31, 2004

(65) Prior Publication Data

US 2004/0217689 A1    Nov. 4, 2004

(30) Foreign Application Priority Data

May 2, 2003    (JP) .............................. 2003-127055

(51) Int. Cl.
*H01J 63/04* (2006.01)
(52) U.S. Cl. ................................ 313/499; 257/E21.413
(58) Field of Classification Search ............... 313/499; 257/E21.413, E27.111, E29.293
See application file for complete search history.

(56) References Cited

U.S. PATENT DOCUMENTS 6,356,331 B1 * 3/2002 Ono et al. .................. 349/141
2002/0047970 A1 * 4/2002 Ono et al. .................. 349/122
2002/0132385 A1 * 9/2002 Dojo et al. .................. 438/30

FOREIGN PATENT DOCUMENTS

| JP | 7-72508 | 6/1993 |
| JP | 7-235541 | 2/1994 |

* cited by examiner

*Primary Examiner*—Joseph Williams
*Assistant Examiner*—Hana Asmat Sanei
(74) *Attorney, Agent, or Firm*—Reed Smith LLP; Stanley P. Fisher, Esq.; Juan Carlos A. Marquez, Esq.

(57) ABSTRACT

The present invention provides a display device which includes signal lines which are formed on an upper surface side of a substrate, an insulation film which is formed such that the film covers the signal lines except for terminal portions of the signal lines, and conductive layers which extend in the extension direction of the signal lines such that the terminal portions traverse the terminal portions. In such a display device, gaps are formed between respective sides of the conductive layer parallel to the extension direction of the conductive layer and the insulation film and holes are formed in the signal lines at portions corresponding to the gaps along the extension direction of the signal lines.

4 Claims, 9 Drawing Sheets

DISPLAY DEVICE WITH INSULATION FILM AND CONDUCTIVE LAYERS ARRANGED IN PERIPHERY OF THE SUBSTRATE

BACKGROUND OF THE INVENTION

1. Field of the Invention

The present invention relates to a display device, and more particularly to the terminal structure of signal lines.

2. Description of the Related Art

An active matrix type display device is, for example, configured such that respective pixels which are mounted on a substrate include switching elements respectively, a scanning signal which is supplied to gate signal lines turns on the switching elements of the respective pixels arranged in parallel in rows, and a video signal which is supplied to drain signal lines through the respective switching elements is supplied to the respective pixels.

Due to such a constitution, in a periphery of a display part which is constituted of a mass of the above-mentioned pixels, terminals for supplying the scanning signal to the respective gate signal lines, terminals for supplying the video signal to the respective drain signal lines are respectively formed in parallel to each other.

Here, the respective terminals are constituted such that at terminal portions of the signal lines which are covered with an insulation film, holes are formed in the insulation film so as to expose portions of the signal lines, and a conductive layer is formed such that the conductive layer covers the exposed portions of the signal lines and peripheries of the insulation film in which the holes are formed.

Further, the display device having such a constitution is usually manufactured such that a substrate which is slightly larger than the above-mentioned substrate is used, signal lines which extend in the direction opposite to the pixel side are formed on the respective terminals, the respective signal lines are connected in common by another wiring layer, and a portion of the substrate on which the wiring layer is formed is cut away together with the substrate before completion of the manufacturing.

The respective signal lines are connected in common by the wiring layer for dispersing static electricity to the respective signal lines through the wiring layer when the static electricity intrudes into one terminal, for example, so as to prevent the breakdown of the switching element attributed to the electrostatic electricity.

SUMMARY OF THE INVENTION

However, with respect to the above-mentioned display device, a following drawback has been pointed out. That is, when the static electricity intrudes, for example, one terminal exposed from the insulation film, the terminal per se is broken due to the Joule's heat attributed to the static electricity. Accordingly, the connection between the signal line which is connected with the terminal and the wiring layer is interrupted and hence, the static electricity diffusion effect cannot be obtained whereby the switching element which is connected to the signal line which is connected to the broken terminal is also broken down.

The present invention has been made under such circumstances and it is an advantage of the present invention to provide a display device which includes terminals which can overcome drawbacks attributed to static electricity.

To explain the summary of representative inventions among inventions disclosed in this specification, they are as follows.

(1)

The display device according to the present invention is, for example, characterized by including signal lines which are formed on an upper surface side of a substrate, wiring layers which are formed such that the wiring layers electrically connect one-side signal lines and another-side signal lines which define regions for forming terminal portions of the signal lines therebetween while obviating regions where the terminal portions of the signal lines are formed, and an insulation film which has holes at regions forming the terminal portions and is formed so as to cover the signal lines and the wiring layer.

(2)

The display device according to the present invention includes, for example, signal lines which are formed on an upper surface side of a substrate, an insulation film which is formed such that the film covers the signal lines except for terminal portions of the signal lines, and conductive layers which extend in the extension direction of the signal lines such that the conductive layers traverse the terminal portions, wherein gaps are formed between respective sides of the conductive layer parallel to the extension direction of the conductive layer and the insulation film and holes are formed in the signal lines at portions corresponding to the gaps along the extension direction of the signal lines.

(3)

The display device according to the present invention is, for example, on the premise of the constitution of (2), characterized in that the display region includes gate signal lines and drain signal lines, wherein a material of the signal lines is equal to a material of the gate signal lines, and a material of the conductive layers is equal to a material of the drain signal lines.

(4)

The display device according to the present invention is, for example, on the premise of the constitution of (2), characterized in that gate signal lines, drain signal lines and interlayer insulation films which are formed between the respective signal lines are formed on a display region, and a material of the insulation films is identical with a material of the interlayer insulation film.

(5)

The display device according to the present invention includes, for example, signal lines which are formed on an upper surface side of the substrate, semiconductor layers which are formed below the signal lines by way of a first insulation film such that the semiconductor layers traverse the signal lines at terminal portions of the signal lines, a second insulation film which is formed on the substrate such that the second insulation film also covers the signal lines and in which holes are formed at regions thereof where the semiconductor layers are formed, and conductive layers which have respective sides thereof in the extension direction of the signal lines arranged at both sides of the signal lines and are connected with respective semiconductor layers, wherein the resistance of the semiconductor layers is lowered by introducing impurities there into using the signal lines as masks.

(6)

The display device according to the present invention is, for example, on the premise of the constitution of (5), characterized in that the display region includes gate signal lines and drain signal lines, wherein a material of the signal lines is equal to a material of the gate signal lines, and a material of the conductive layers is equal to a material of the drain signal lines.

(7)

The display device according to the present invention is, for example, on the premise of the constitution of (5), characterized in that the display region includes thin film transistors, wherein a material of the semiconductor layers is equal to a material of semiconductor layers of the thin film transistors.

(8)

The display device according to the present invention is, for example, on the premise of the constitution of (5), characterized in that the display region includes thin film transistors, wherein a material of the first insulation film is equal to a material of gate insulation films of the thin film transistors.

(9)

The display device according to the present invention is, for example, on the premise of the constitution of (5), characterized in that gate signal lines, drain signal lines and interlayer insulation films which are formed between the respective signal lines are formed on a display region, and a material of the second insulation film is identical with a material of the interlayer insulation films.

The present invention is not limited to the above-mentioned constitutions and various modifications are conceivable without departing from the technical concept of the present invention.

BRIEF DESCRIPTION OF THE DRAWINGS

FIGS. 5A to 5H are step view showing another embodiment of a manufacturing method of terminal portions of the display device according to the present invention;

DESCRIPTION OF THE PREFERRED EMBODIMENTS

Preferred embodiments of a display device according to the present invention are explained in detail in conjunction with drawings hereinafter.

Embodiment 1

<<Whole Constitution>>

Figure 2A:
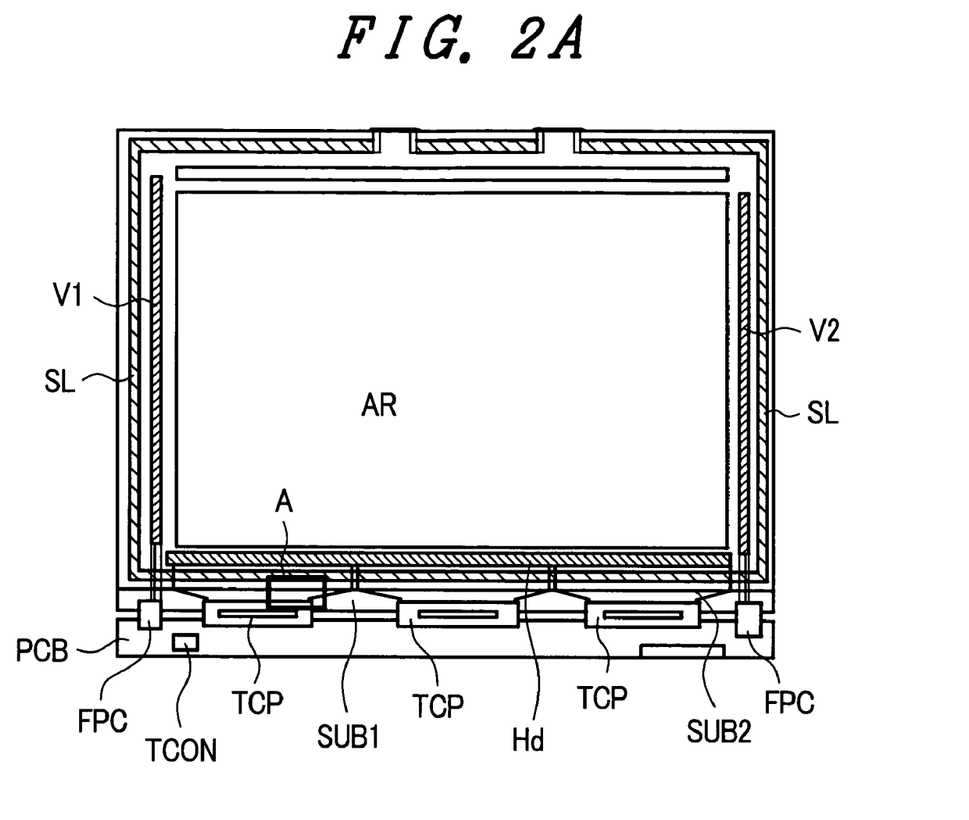
FIGS. 2A and 2B are schematic constitutional view showing one embodiment of the display device according to the present invention.
Figure 2B:
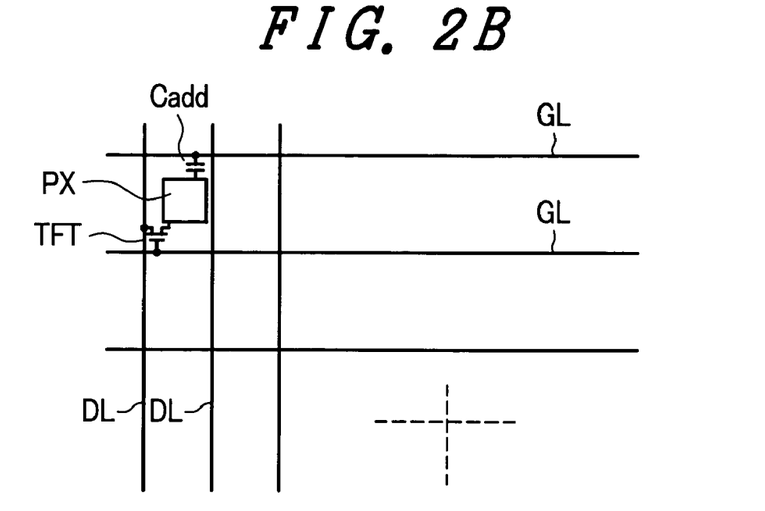

FIG. 2A is a plan view showing the whole of the display device, for example, the liquid crystal display device according to the present invention.

In FIG. 2A, there are provided a pair of transparent substrates SUB1, SUB2 which are arranged to face each other with liquid crystal therebetween, wherein the liquid crystal is sealed by a sealing material SL which also performs a function of fixing another transparent substrate SUB2 to one transparent substrate SUB1.

With respect to a region surrounded by the sealing material SL, on a region at a center portion except for a slight periphery thereof, a large number of pixels are arranged in a matrix array and a mass of these pixels constitute a liquid crystal display part AR.

The liquid crystal display part AR defines regions which are surrounded by gate signal lines GL which extend in the x direction and are arranged in parallel in the y direction and drain signal lines DL which extend in the y direction and are arranged in parallel in the x direction as pixel region, wherein each pixel region includes a thin film transistor TFT which is turned on in response to a scanning signal from one-side gate signal line GL and a pixel electrode PX to which a video signal from one-side drain signal line DL is supplied through the thin film transistor TFT.

The pixel electrode PX generates an electric field between the pixel electrode PX and a counter electrode CT which is formed in common with respective pixel regions on a liquid-crystal-side surface of the transparent substrate SUB2 and optical transmissivity of the liquid crystal in the pixel is controlled in response to the electric field.

Further on each pixel region, for storing the video signal supplied to the pixel electrode PX for a relatively long time, a capacitive element Cadd is formed between another gate signal line GL and the pixel electrode PX, wherein another gate signal line is arranged to sandwich the pixel between another gate signal line GL and the gate signal line GL for driving the thin film transistor TFT of the pixel.

Respective ends of the gate signal lines GL are connected to scanning signal drive circuits V1, V2 which are formed close to the inside of the sealing material SL and the scanning signal is sequentially supplied one after another to the respective gate signal lines GL by the scanning signal drive circuits V1, V2.

Further, for example, respective lower ends of the drain signal lines DL in the drawing are connected to a video signal division drive circuit Hd which is formed close to the inside of the sealing material SL and the video signal is supplied to the respective drain signal lines DL by the video signal division drive circuit Hd.

Here, to an end side of the transparent substrate SUB1 at a side where the video signal division drive circuit Hd is formed and outside the sealing material SL, output terminals of a video signal drive circuit H which supplies the signal to the video signal division drive circuit Hd are connected.

The video signal drive circuit H is, for example, constituted of a plurality of semiconductor devices TCP formed in a film carrier method, for example. Here, the film carrier type semiconductor device TCP is constituted such that a semiconductor chip is mounted on a surface of the flexible printed board, and input bumps and output bumps thereof are respectively pulled out to input terminals and output terminals through a wiring layer formed on the flexible printed circuit board.

Further, the input terminals of the video signal drive circuit H which is constituted of respective semiconductor devices TCP are connected to a printed circuit board PCB which is arranged close to the transparent substrate SUB1, wherein signals are supplied to the video signal drive circuit H from the printed circuit board PCB side.

A display control circuit TCON and the like are mounted on the printed circuit board PCB and signals are also supplied to the above-mentioned scanning signal drive circuits V1, V2 from the printed circuit board PCB side through a flexible printed circuit board FPC.

Here, in the liquid crystal display device described in this embodiment, the thin film transistor TFT has a semiconductor layer thereof formed of polysilicon (p-Si), for example. Due to such a constitution, semiconductor layers of MIS (Metal Insulator Semiconductor) type transistors which constitute the scanning signal drive circuit V1, V2 and the video signal division drive circuit Hd are also formed of polysilicon.

<<Terminal Portions of Drain Signal Lines>>

FIG. 1 is a plan view showing the constitution of a terminal portion of the drain signal line DL to which an output terminal of the video signal drive circuit H is connected in the periphery of the transparent substrate SUB1. For example, FIG. 1 shows the terminal portion of the drain signal line DL which is arranged at a portion surrounded by a frame A in FIG. 2A.

Figure 1A:
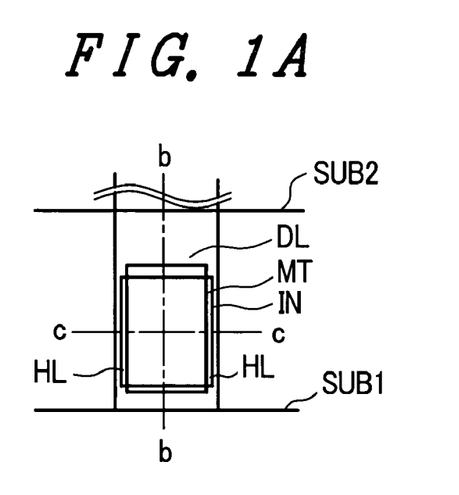
FIGS. 1A to 1c are constitutional view showing one embodiment of the constitution of a terminal portion and FIG. 1D is circuit for explanation of a display device according to the present invention.

That is, with respect to this drain signal line DL, in a state that the drain signal line DL which is formed on the liquid crystal display part AR is constituted of a signal line which reaches a periphery of the transparent substrate SUB1 through the video signal division drive circuit Hd, a portion of the signal line which extends from the video signal division drive circuit Hd is shown.

Figure 1B:
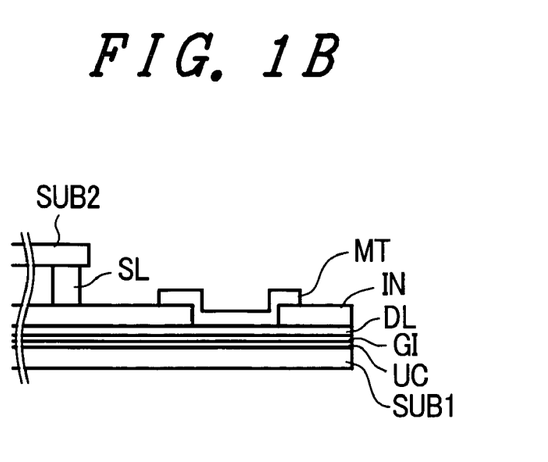
Figure 1C:
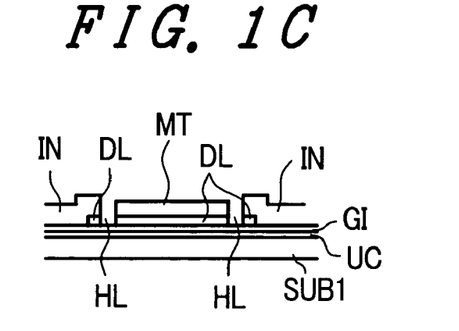

Further, FIG. 1B is a cross-sectional view taken along a line b-b in FIG. 1A and FIG. 1C is a cross-sectional view taken along a line c-c in FIG. 1A.

In FIG. 1A, FIG. 1B and FIG. 1C, the drain signal line DL is formed on a surface of a background film UC and a first insulation film GI which are sequentially formed on a surface of the transparent substrate SUB1. Here, the background film UC is a film provided for preventing the intrusion of an ionic material in the inside of the transparent substrate SUB1 into the thin film transistor TFT or the like and the first insulation film is a film which is made to function as a gate insulation film in a region where the thin film transistor TFT is formed. Both of these films are formed such that the films extend to the periphery of the transparent substrate SUB1.

The drain signal lines DL which extend from the video signal division drive circuit Hd are configured to be formed simultaneously with the formation of the gate signal lines GL which are formed on the liquid crystal display part AR. Accordingly, a material of the drain signal lines DL is substantially equal to a material of the gate signal lines GL.

Then, on the surface of the transparent substrate SUB1, a second insulation film IN is formed such that the second insulation film IN covers the drain signal lines DL except for regions where terminal portions are formed. The second insulation film IN functions as an interlayer insulation film which is formed between the gate signal line GL and the drain signal line DL in the region of the liquid crystal display part AR and is formed such that the second insulation film IN extends to a periphery of the transparent substrate SUB1.

A portion of the drain signal line DL which is exposed from the second insulation film IN is formed into a rectangular shape having two sides parallel to the running direction of the drain signal line, for example. Along the respective sides of the portion, that is, along the running direction of the drain signal line DL, elongated holes HL are formed in the drain signal line DL. The elongated holes HL are formed to expose the first insulation film GI which is formed as a layer below the drain signal line DL.

Further, in the portion of the drain signal line DL which is exposed from the second insulation film IN, a conductive layer MT which makes the elongated holes HL positioned at both sides thereof and extends in the extension direction of the drain signal line DL is formed. Respective end portions of the conductive layer MT slightly extend beyond the portion of the drain signal line DL which is exposed from the second insulation film IN and hence, the conductive layer MT is overlapped to the second insulation film IN.

The conductive layer MT is, in the portion of the drain signal line DL which is exposed from the second insulation film IN, formed such that the conductive layer MT comes into direct contact with the drain signal line DL thus forming the terminal portion of the drain signal line DL at the portion.

Here, since the conductive layers MT are formed on the liquid crystal display part AR simultaneously with the formation of the drain signal lines DL, a material of the conductive layer MT is substantially equal to a material of the drain signal lines DL.

Figure 1D:
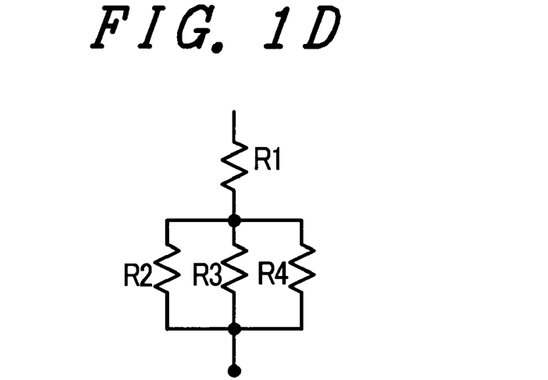

In the vicinity of the terminal portion of the drain signal line DL which has the above-mentioned constitution, due to the above-mentioned two elongated holes HL which are formed along the extension direction of the drain signal line DL, three electric paths are formed electrically. Accordingly, assuming an electric resistance of the drain signal line DL up to the terminal portion thereof as R1 and respective electric resistances of these three paths as R2, R3, R4, an equivalent circuit becomes as shown in FIG. 1D.

Here, the electric paths which correspond to the resistances R2, R4 arranged outside the elongated holes HL are configured to be present below the second insulation film IN. That is, even when the static electricity intrudes into the conductive layer MT which constitutes the terminal portion and the conductive layer MT is broken down due to Joule's heat, the electric paths which are present below the second insulation film IN, that is, the portion of the drain signal line DL remains in the extension direction thereof.

Figure 3A:
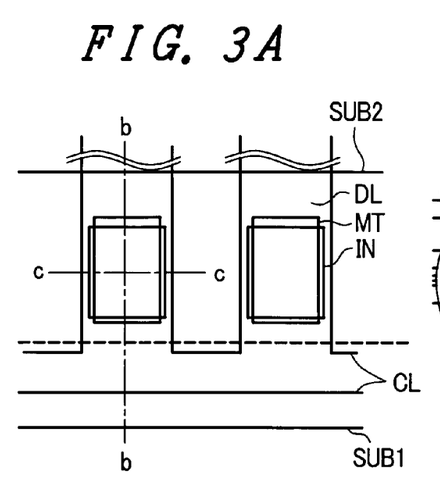
FIGS. 3A to 3c are constitutional view showing one embodiment of the constitution of a terminal portion and FIG. 3D is circuit for explanation of a display device according to the present invention.
Figure 3B:
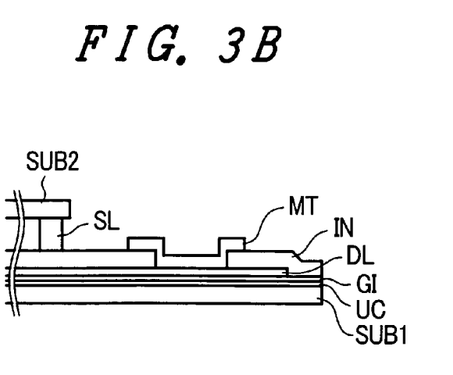
Figure 3C:
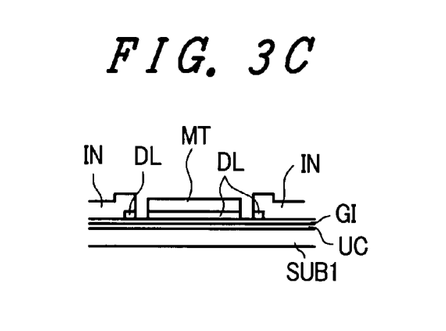

FIG. 3A is a view showing the constitution of the vicinity of the above-mentioned terminal portion in the course of manufacturing the above-mentioned liquid crystal display device and corresponds to FIG. 1A. Further, FIG. 3B is a cross-sectional view taken along a line b-b in FIG. 3A and FIG. 3C is a cross-sectional view taken along a line c-c in FIG. 3A.

The transparent substrate SUB1 extends also to the outside of the terminals (with respect to the liquid crystal display part AR) and hence, the transparent substrate having a size larger than the transparent substrate SUB1 which is completed as the liquid crystal display device is used.

Figure 3D:
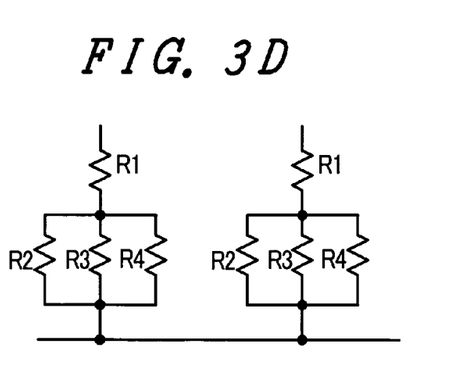

On an extension portion of the transparent substrate SUB1, a wiring layer CL which extends in the direction orthogonal to the drain signal lines DL is formed, wherein the wiring layer CL is, for example, integrally formed with the respective drain signal lines DL and is also electrically connected with the respective drain signal lines DL. An equivalent circuit of this embodiment is shown in FIG. 3D.

Due to such a constitution, when the static electricity intrudes into the terminal of one drain signal line DL, for example, the static electricity is dispersed in the respective drain signal lines DL through the above-mentioned wiring layer CL whereby it is possible to prevent the breakdown of the above-mentioned switching element attributed to the static electricity.

Here, as described previously, with respect to the terminal into which the static electricity intrudes, even when the conductive layer MT and the portion of the drain signal line DL arranged below the conductive layer MT break down, the portion of the drain signal line DL which is arranged below the second insulation film IN remains at both sides of the terminal and hence, it is possible to eliminate the possibility that the disconnection of the drain signal line DL and the wiring layer CL is induced. Due to such a constitution, it is possible to obtain the terminal which can achieve the reliable static electricity prevention measures.

Here, immediately before the completion of the liquid crystal display device as a product, the transparent substrate SUB1 is cut out for every wiring layer CL at a portion indicated by a dotted line in FIG. 3A.

<<Manufacturing Method of Terminal Portion>>

FIG. 4 is a step view showing one embodiment of a method for manufacturing terminal portions of the drain signal lines DL, wherein the step corresponds to a step of a portion of the cross-sectional view shown in FIG. 1C. The method for manufacturing terminal portions of the drain signal lines DL is explained in order of steps hereinafter.

Step 1.

Figure 4A:
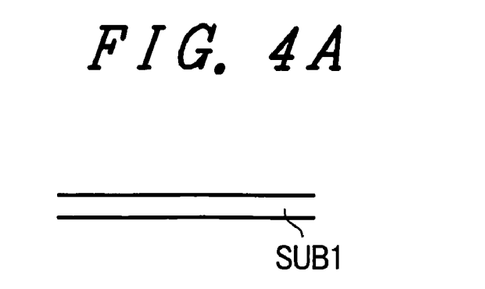
FIGS. 4A to 4H are step view showing one embodiment of a manufacturing method of terminal portions of the display device according to the present invention.

The transparent substrate SUB1 is prepared (FIG. 4A).

Step 2.

Figure 4B:
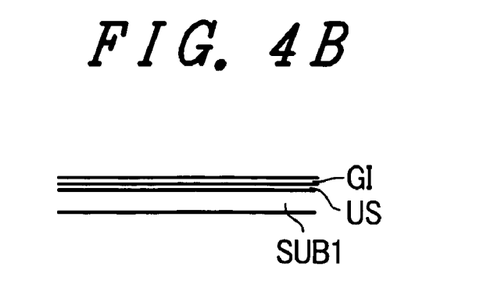

The background film UC is formed on the main surface of the transparent substrate SUB1 and the first insulation film GI is formed on a surface of the background film UC. Here, although not shown in the drawing, in the liquid crystal display part AR, after forming the background film UC, the semiconductor layers (p-Si) of the thin film transistors TFT which are formed in the respective pixels are formed, wherein the first insulation film GI constitutes a film which functions as the gate insulation film of the thin film transistor TFT (FIG. 4B).

Step 3.

Figure 4C:
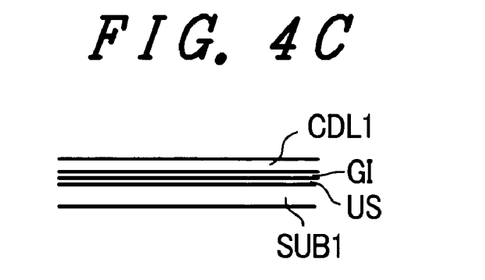

The first conductive layer CDL1 is formed over the whole area of the surface of the first insulation film GI. The conductive layer CDL1 becomes a material layer which constitutes the gate signal lines GL in the liquid crystal display part AR and becomes a material layer which constitutes the drain signal lines DL in the vicinity of the terminal portions of the drain signal lines DL. That is, although these drain signal lines DL are electrically connected with the drain signal lines DL which are formed in the liquid crystal display part AR through the video signal division drive circuit Hd, these drain signal lines DL are formed on the layer different from the layer on which drain signal lines DL which are formed in the liquid crystal display part AR are formed (FIG. 4C).

Step 4.

Figure 4D:
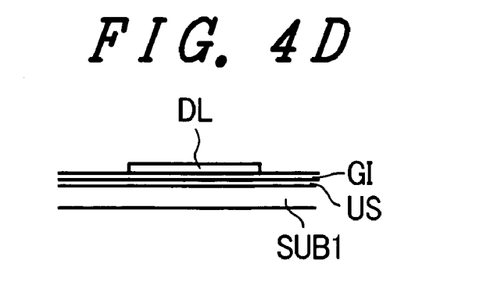

The drain signal lines DL are formed by patterning the first conductive layers CDL1 (FIG. 4D).

Step 5.

Figure 4E:
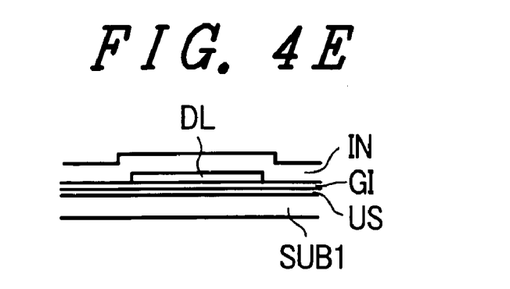

The second insulation film IN is formed on the transparent substrate SUB1 such that the second insulation film IN also covers the drain signal lines DL. The second insulation film IN constitutes a film for obtaining the interlayer insulation between the gate signal lines GL and the drain signal lines DL which are formed in a succeeding step in the liquid crystal display part AR (FIG. 4E).

Step 6.

Figure 4F:
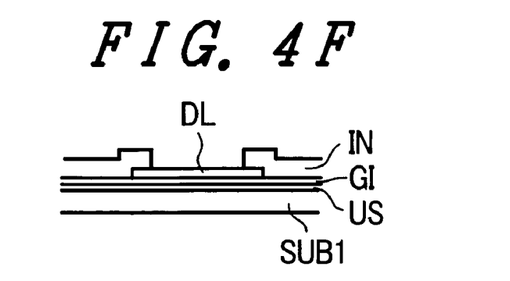

In the regions where the terminal portions of the drain signal lines DL are formed, the holes are formed in the second insulation film IN so as to expose one portions of the drain signal lines DL from the second insulation film IN (FIG. 4F).

Step 7.

Figure 4G:
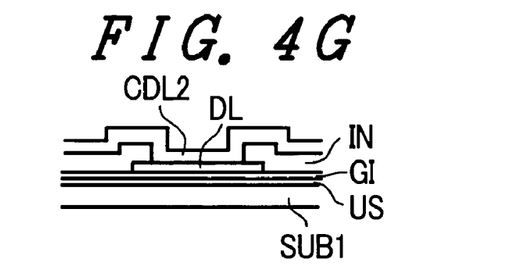

The second conductive layer CDL2 is formed on the whole region of the transparent substrate SUB1 such that the second conductive layer CDL2 also covers the holes formed in the second insulation film IN. The second conductive layer CDL2 is formed as a material of the drain signal lines DL in the liquid crystal display part AR (FIG. 4G).

Step 8.

Figure 4H:
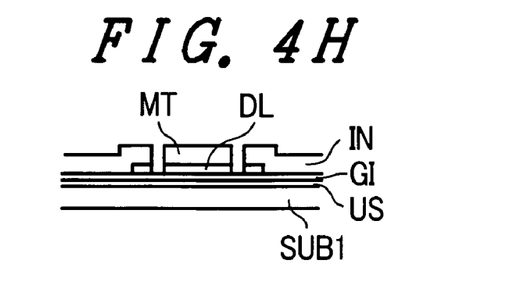

The conductive layer MT is formed by patterning the second conductive layer CDL2. In this case, in the terminal portions of the drain signal lines DL, while the second conductive layer CDL2 is left at the hole portions formed in the second insulation layer IN and the peripheral portions of the holes, the elongated holes HL are formed along the respective sides of the hole in the direction equal to the extension direction of the drain signal lines DL. Here, the elongated holes HL are formed such that the elongated holes HL reach the drain signal lines DL so as to expose the first insulation film GI arranged below the drain signal lines DL through the elongated holes HL (FIG. 4H).

Embodiment 2

FIG. 5 is a step view showing another embodiment of the method for manufacturing the terminal portions of the drain signal lines DL and corresponds to FIG. 4. The method for manufacturing terminal portions of the drain signal lines is explained in order of steps hereinafter.

Step 1.

Figure 5A:
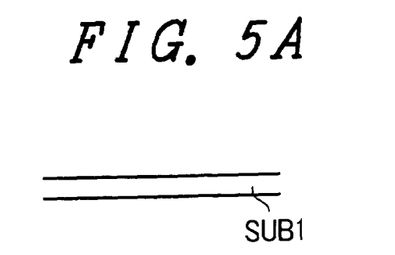

The transparent substrate SUB1 is prepared (FIG. 5A).

Step 2.

Figure 5B:
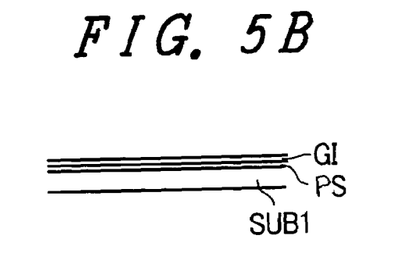

The background film UC is formed on the main surface of the transparent substrate SUB1 and the first insulation film GI is formed on a surface of the background film UC. Here, although not shown in the drawing, in the liquid crystal display part AR, after forming the background film UC, the semiconductor layers (p-Si) of the thin film transistors TFT which are formed in the respective pixels are formed, wherein the first insulation film GI constitutes a film which functions as the gate insulation film of the thin film transistor TFT (FIG. 5B).

Step 3.

Figure 5C:
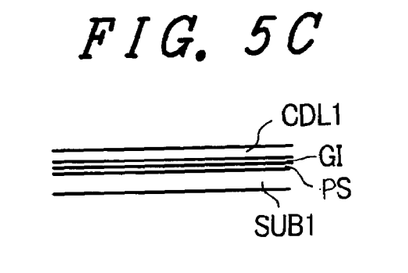

The first conductive layer CDL1 is formed over the whole area of the surface of the first insulation film GI. The first conductive layer CDL1 becomes a material layer which constitutes the gate signal lines GL in the liquid crystal display part AR and becomes a material layer which constitutes the drain signal lines DL in the vicinity of the terminal portions of the drain signal lines DL. That is, although these drain signal lines DL are electrically connected with the drain signal lines DL which are formed in the liquid crystal display part AR through the video signal division drive circuit Hd, these drain signal lines DL are formed on the layer different from the layer on which drain signal lines DL which are formed in the liquid crystal display part AR are formed (FIG. 5C).

Step 4.

Figure 5D:
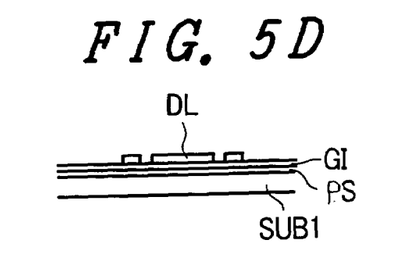

The drain signal lines DL are formed by patterning the first conductive layers CDL1. Here, simultaneously with the formation of the drain signal lines DL, two elongated holes which extend in the extension direction of the drain signal lines DL are formed in each terminal portion forming region of the drain signal line DL (FIG. 5D).

Step 5.

Figure 5E:
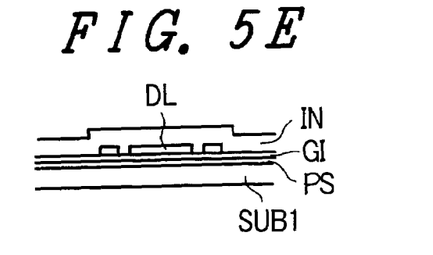

The second insulation film IN is formed on the transparent substrate SUB1 such that the second insulation film IN also covers the drain signal lines DL. The second insulation film IN constitutes a film for obtaining the interlayer insulation between the gate signal lines GL and the drain signal lines DL which are formed in a succeeding step in the liquid crystal display part AR (FIG. 5E).

Step 6.

Figure 5F:
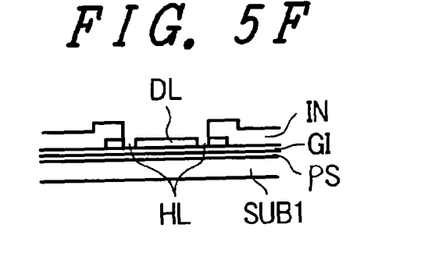

In the regions where the terminal portions of the drain signal lines DL are formed, the holes are formed in the second insulation film IN so as to expose one portion of the drain signal lines DL from the second insulation film IN. Here, the elongated holes HL are formed such that the elongated holes HL are arranged close to respective sides in the direction equal to the extension direction of the drain signal lines DL out of the respective sides of each hole so as to expose also the first insulation film GI (FIG. 5F).

Step 7.

The second conductive layer CDL2 is formed on the whole area of the surface of the transparent substrate SUB1 such that the second conductive layer CDL2 also covers the holes formed in the second insulation film IN. The second conductive layer CDL2 is used as a material of the drain signal lines DL in the liquid crystal display part AR (FIG. 5G).

Step 8.

The conductive layer MT is formed by patterning the second conductive layer CDL2. In this case, the conductive layer MT is formed such that the elongated holes HL formed in the drain signal lines DL are exposed (FIG. 5H).

Embodiment 3

FIG. 6 is a constitutional view showing another embodiment of the display device according to the present invention and corresponds to FIG. 1. Here, FIG. 6A is a plan view, FIG. 6B is a cross-sectional view taken along a line b-b in FIG. 6A and FIG. 6C is a cross-sectional view taken along a line c-c in FIG. 6A.

Figure 6A:
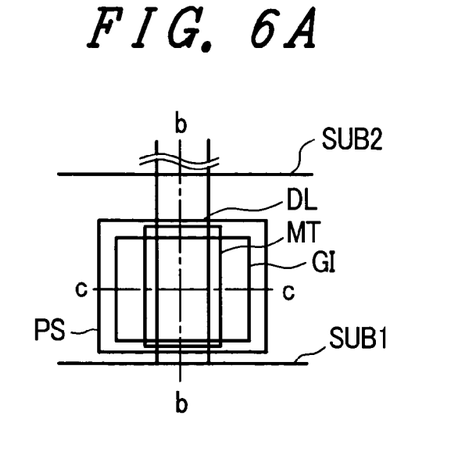
FIGS. 6A to 6c are constitutional view showing another embodiment of the constitution of a terminal portion and FIG. 6D is circuit for explanation of a display device according to the present invention.

The constitution which makes this embodiment different from the embodiment shown in FIG. 1 lies in that, first of all, in forming the semiconductor layers of the thin film transistors TFT in the liquid crystal display part AR, the semiconductor layers are utilized for the formation of the terminal portions of the drain signal lines DL.

Figure 6B:
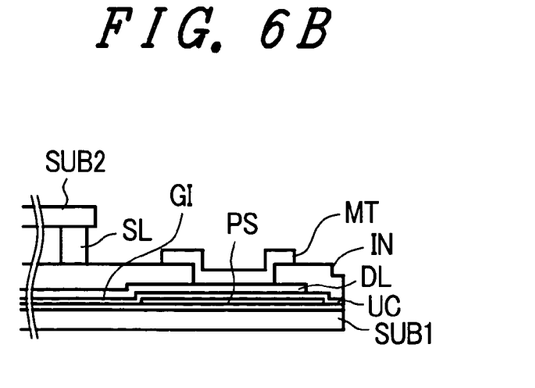
Figure 6C:
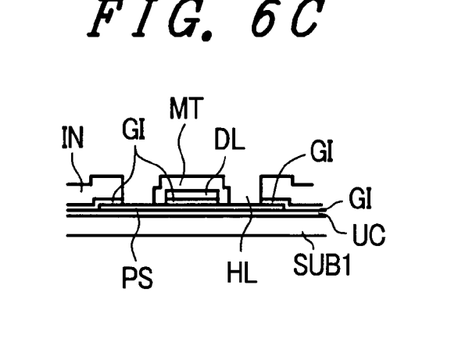

That is, the semiconductor layers of the thin film transistors TFT are positioned below the gate electrodes (gate signal lines GL) by way of the first insulation film (the gate insulation film) GI and hence, also in the terminal portions, the semiconductor layers PS are formed below the drain signal lines DL which are formed simultaneously with the formation of the gate signal lines GL by way of the first insulation film GI.

The semiconductor layer PS, in the region for forming the terminal portion of the drain signal lines DL, is formed in a rectangular pattern, for example, wherein the semiconductor layer PS extends beyond the drain signal line DL in the direction orthogonal to the extension direction of the drain signal lines DL.

Here, in the liquid crystal display part, source regions and drain regions of the thin film transistors TFT are formed due to doping of impurities using the gate electrodes by masks and hence, with respect to the semiconductor layers PS at the terminal portions, portions which are formed in a state that the portions extend from the drain signal lines DL become conductive.

Further, with respect to the second insulation film IN which covers the drain signal lines DL, at the region thereof where the terminal portions are formed, holes which have an area smaller than an area of the semiconductor layers PS and have the substantially same shape as the semiconductor layers PS are formed in a state that the center of the holes is aligned with the center of the semiconductor layers PS. In other words, below the peripheral portions of the holes HL formed on the second insulation film IN, the semiconductor layers PS are formed in an extended manner.

Then, the conductive layers MT are formed such that the conductive layers MT cover the drain signal lines DL exposed through the holes HL formed in the second insulation film IN, wherein the end portions of each conductive layer MT in the direction that the drain signal line DL extends are formed to be overlapped to the second insulation film IN. Further, a width of the conductive layer MT is set to a value which substantially allows the exposure of the semiconductor layer PS at both sides in the direction which agrees with the extension direction of the drain signal lines DL.

Figure 6D:
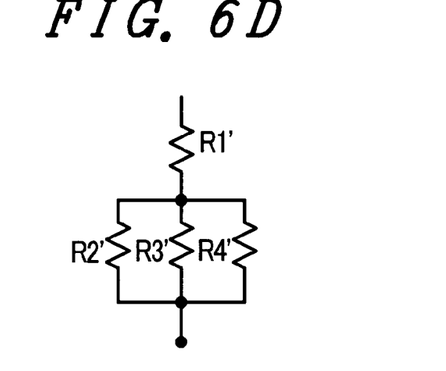

In the terminal portion having such a constitution, in the same manner as the above-mentioned embodiment, three electric paths are formed electrically and the equivalent circuit is constituted as shown in FIG. 6D. In FIG. 6D, the resistance R1' is a resistance value of a signal line leading to the terminal portion of the drain signal line DL, the resistance R3' is a resistance value of the drain signal line DL and the conductive layer MT which is overlapped to the drain signal line DL as a layer above the drain signal line DL, the resistance R2' is a resistance value of one-side semiconductor layer PS out of the semiconductor layers PS which are arranged at both sides of the drain signal line DL at the terminal portion, and the resistance R4' is a resistance value of another-side semiconductor layer PS out of the semiconductor layers PS which are arranged at both sides of the drain signal line DL at the terminal portion.

Figure 7A:
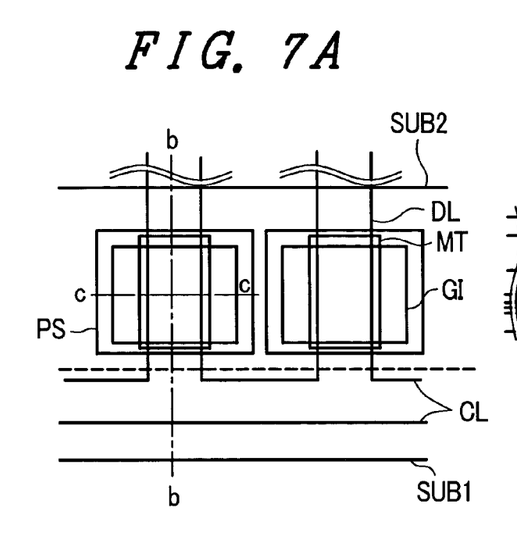
FIGS. 7A to 7c are constitutional view showing another embodiment of the constitution of a terminal portion and FIG. 7D is circuit for explanation of a display device according to the present invention.
Figure 7B:
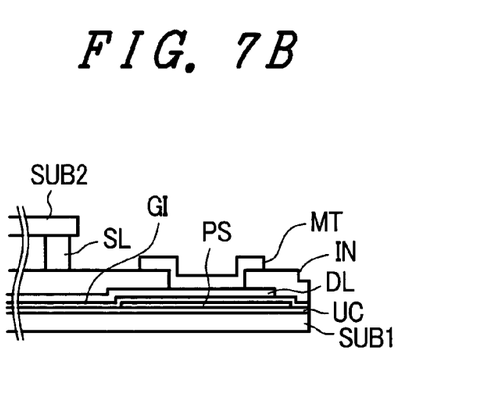
Figure 7C:
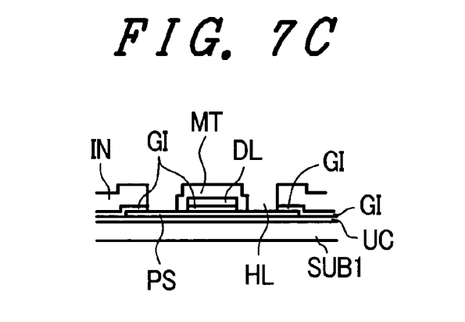

FIG. 7A is a view showing the constitution of the vicinity of the terminal portion in the course of manufacturing in the above-mentioned liquid crystal display device and corresponds to FIG. 6A. Further, FIG. 7B is a cross-sectional view taken along a line b-b in FIG. 7A and FIG. 7C is a cross-sectional view taken along a line c-c in FIG. 7A.

The transparent substrate SUB1 also extends to the outside of the terminal (with respect to the liquid crystal display part AR) and a transparent substrate which is larger than the transparent substrate SUB1 which is completed as a product of the liquid crystal display device is used.

Figure 7D:
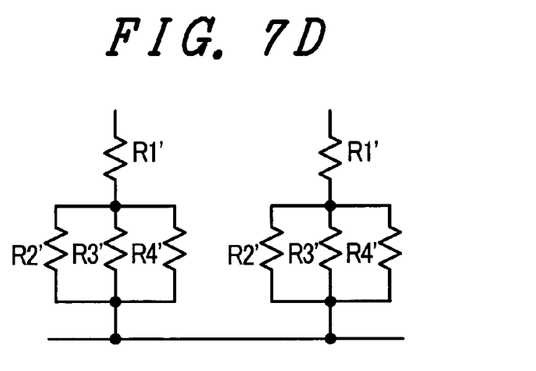

A wiring layer CL which extends in the direction orthogonal to the drain signal lines DL is formed on the extension portion of the transparent substrate SUB1 and the wiring layer CL is, for example, integrally formed with and is electrically connected with the respective drain signal lines DL. The equivalent circuit of such a constitution is shown in FIG. 7D.

Due to such a constitution, when the static electricity intrudes into the terminal of one drain signal line DL, for example, the static electricity is dispersed in the respective drain signal lines DL through the above-mentioned wiring layer CL whereby it is possible to prevent the breakdown of the above-mentioned switching element attributed to the static electricity.

Here, as described previously, with respect to the terminal into which the static electricity intrudes, even when the conductive layer MT and the portion of the drain signal line DL arranged below the conductive layer MT break down, the portion of the semiconductor layer PS which is arranged below the second insulation film IN remains at both sides of the terminal and hence, it is possible to eliminate the possibility that the disconnection of the drain signal line DL and the wiring layer CL is induced. Due to such a constitution, it is possible to obtain the terminal which can achieve the reliable static electricity prevention measures.

Here, immediately before the completion of the liquid crystal display device as a product, the transparent substrate SUB1 is cut out for every wiring layer CL at a portion indicated by a dotted line in FIG. 7A.

Embodiment 4

FIG. 8 is a step view showing one embodiment of a method for manufacturing terminal portions of the drain signal lines shown in FIG. 3 and corresponds to a step of a portion of the cross-sectional view shown in FIG. 7C. The method for manufacturing terminal portions of the drain signal lines is explained in order of steps hereinafter.

Step 1.

Figure 8A:
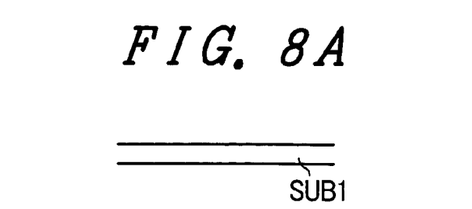
FIGS. 8A to 8L are step view showing another embodiment of a manufacturing method of terminal portions of the display device according to the present invention.

The transparent substrate SUB1 is prepared (FIG. 8A).

Step 2.

Figure 8B:
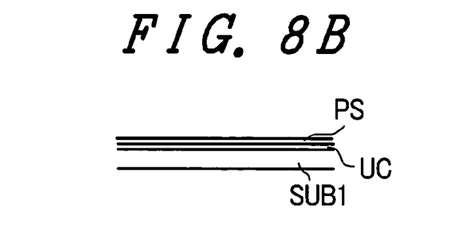

The background film UC is formed on the main surface of the transparent substrate SUB1 and the semiconductor layer (p-Si) PS is formed on a surface of the background film UC. Here, the semiconductor layer PS constitutes a film which functions as the semiconductor layer of the thin film transistor TFT in the liquid crystal display part AR (FIG. 8B).

Step 3.

Figure 8C:
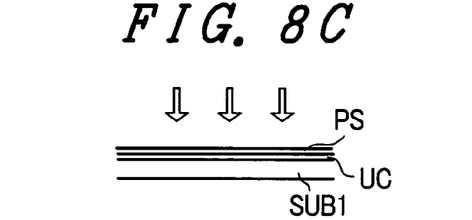

For example, laser annealing is applied to the semiconductor layer PS so as to crystallize the semiconductor layer PS (FIG. 8C).

Step 4.

Figure 8D:
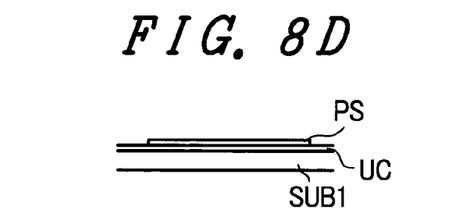

The semiconductor layers PS are formed by patterning and the semiconductor layers PS are left in the regions where the terminal portions are formed in a state that the semiconductor layers PS traverse the drain signal lines DL formed in a later step. The patterning of the semiconductor layers PS is performed simultaneously with the patterning of the semiconductor layers of the thin film transistors TFT in the liquid crystal display part AR (FIG. 8D).

Step 5.

Figure 8E:
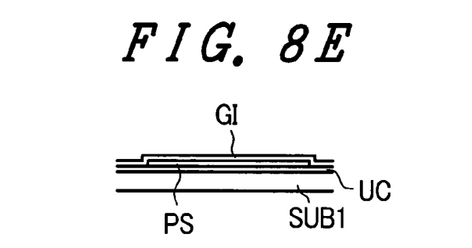

The first insulation film GI is formed on the surface of the transparent substrate SUB1 such that the first insulation film GI also covers the semiconductor layers PS. The first insulation film GI constitutes a film which functions as a gate insulation film for the thin film transistors TFT in the liquid crystal display part AR (FIG. 8E).

Step 6.

Figure 8F:
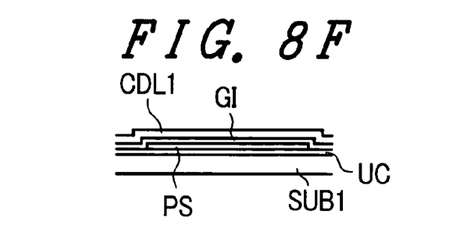

The first conductive layer CDL1 is formed over the whole region of the surface of the first insulation film GI. The first conductive layer constitutes a material layer for forming the gate signal lines GL in the liquid crystal display part AR (FIG. 8F).

Step 7.

Figure 8G:
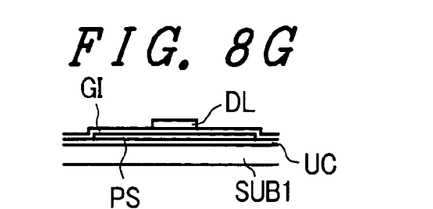

The drain signal lines DL are formed by patterning the first conductive films CDL1 (FIG. 8G).

Step 8.

Figure 8H:
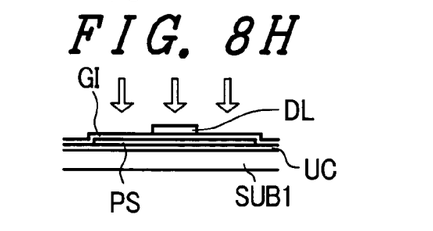

Using the drain signal line DL as a mask, the semiconductor layers PS which are projected from both sides of each drain signal line DL are doped with impurities through the first insulation film GI. Due to such doping, the semiconductor layer PS can form the conductive layers having the low resistance at both sides of the drain signal line DL (FIG. 8H).

Step 9.

Figure 8I:
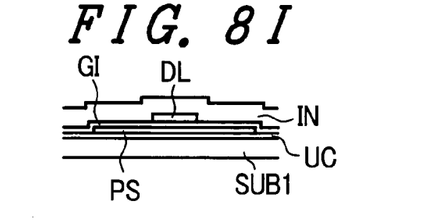

The second insulation film IN is formed on the surface of the transparent substrate SUB1 such that the second insulation film IN also covers the drain signal lines DL. The second insulation film IN constitutes a film which performs the interlayer insulation between the gate signal lines GL and the drain signal lines DL which are formed in succeeding steps in the liquid crystal display part AR (FIG. 8I).

Step 10.

Figure 8J:
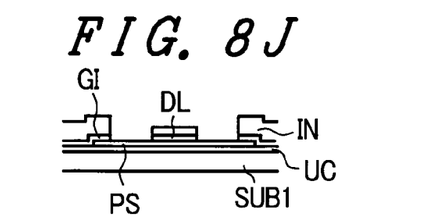

The holes HL are formed in the second insulation film IN so as to expose the semiconductor layers through the holes HL. In this case, each hole HL has a center axis thereof substantially aligned with a center axis of the semiconductor layer PS and has a smaller area than the semiconductor layer PS and has the substantially same shape as the semiconductor layer PS (FIG. 8J).

Step 11.

Figure 8K:
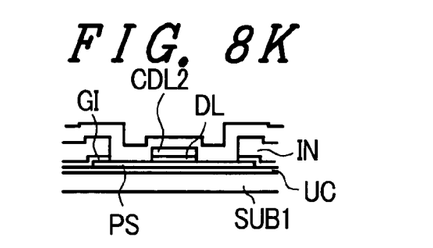

The second conductive layer CDL2 is formed on the whole region of the surface of the transparent substrate SUB1 such that the second conductive layer CDL2 also covers the holes HL formed in the second insulation film IN. The second conductive layer CDL2 is used as a material of the drain signal lines DL in the liquid crystal display part AR (FIG. 8K).

Step 12.

Figure 8L:
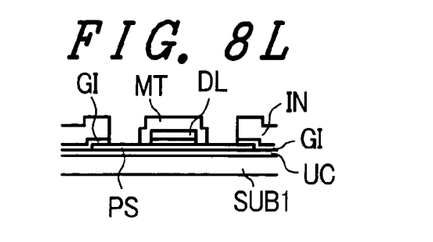

The second conductive layers CDL2 are formed by patterning. The second conductive layers CDL2 which are formed by patterning are connected with the semiconductor layers PS in the vicinity of respective sides along the extension direction of the drain signal lines DL and, at the same time, the second conductive layers CDL2 are configured to be overlapped to the second insulation film IN at respective sides orthogonal to the respective sides.

Due to the second conductive layers CDL2, each drain signal line DL is connected with the respective conductive semiconductor layers PS which are formed at both sides of the drain signal line DL (FIG. 8L).

Embodiment 5

Figure 9:
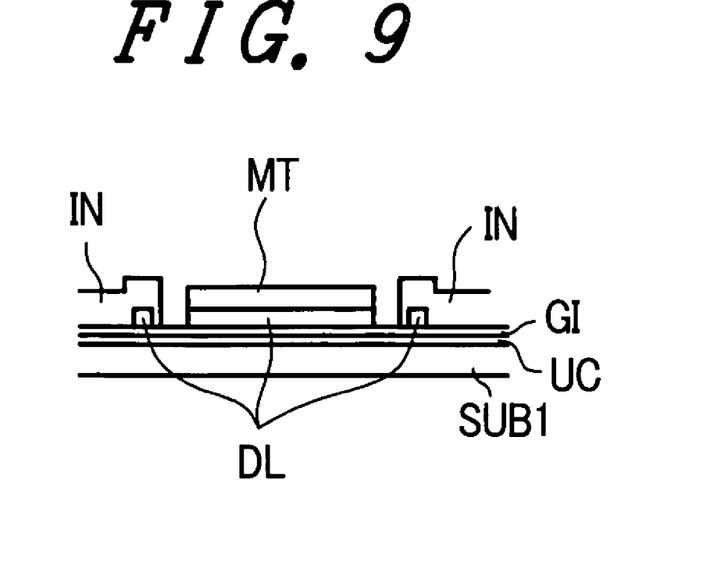
FIG. 9 is a cross-sectional view showing another embodiment of the constitution of a terminal portion of a display device according to the present invention.

FIG. 9 is a constitutional view showing another embodiment of the display device according to the present invention and corresponds to FIG. 1C. The constitution which makes this embodiment different from the embodiment shown in FIG. 1C lies in that among three electric paths at the terminal portion of the drain signal line DL, other two electric paths except for the center electric path are completely covered with the second insulation film IN. That is, these electric paths have also side wall surfaces thereof covered with the second insulation film IN.

The above-mentioned electric paths which are completely covered with the second insulation film IN can reliably obviate the breakdown thereof attributed to the static electricity.

Embodiment 6

Figure 10:
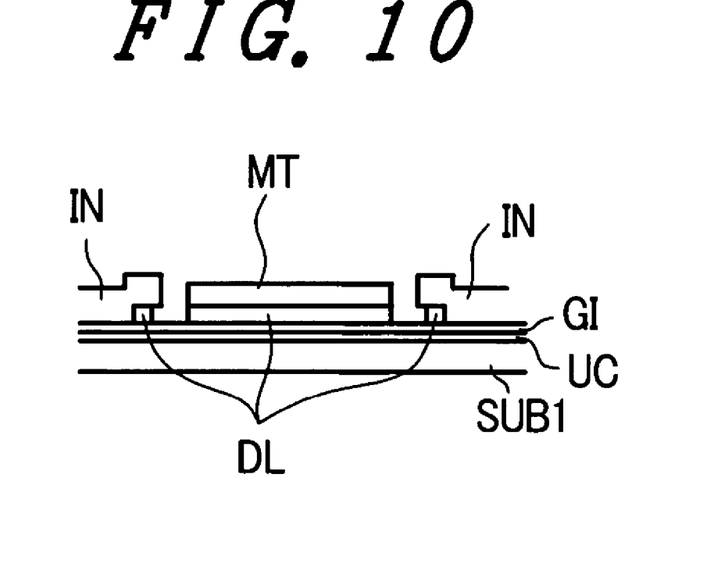
FIG. 10 is a cross-sectional view showing another embodiment of the constitution of a terminal portion of a display device according to the present invention.

FIG. 10 is a constitutional view showing another embodiment of the display device according to the present invention and corresponds to FIG. 1C. The constitution which makes this embodiment different from the embodiment shown in FIG. 1C lies in that among three electric paths at the terminal portion of the drain signal line DL, other two electric paths except for the center electric path are positioned at a side deeper (approximately 0.5 μm) than a side wall surface of the second insulation film IN formed above the terminal portion.

Also in this case, it is possible to sufficiently obtain the object of the present invention.

Here, in the above-mentioned respective embodiments, the conductive layer MT formed in the terminal portion of the signal line is made of a material equal to a material of the drain signal line DL in the liquid crystal display part. However, it is needless to say that the material of the conductive film MT is not limited to such a material and may be equal to the material of the pixel electrodes PX, that is, a light transmitting material such as ITO (Indium Tin Oxide), ITZO (Indium Tin Zinc Oxide), IZO (Indium Zinc Oxide), $SnO_2$ (tin oxide), $In_2O_3$ (yttrium oxide) or the like.

Further, although the present invention has been explained in conjunction with embodiments by taking the liquid crystal display device as the example, it is needless to say that the present invention is applicable to other display device such as an organic EL display device. Terminal portions of the organic EL display device also adopts the substantially same constitution as the terminal portions of the liquid crystal display device and hence, has the same drawback.

The above-mentioned embodiments may be used in a single form or in combination. It is because the advantageous effects of the respective embodiments can be obtained in a single form or synergistically.

As can be clearly understood from the foregoing explanation, according to the display device of the present invention, the display device includes the terminals which can overcome the drawbacks attributed to the static electricity.

What is claimed is:

1. A display device comprising:
   signal lines which are formed on an upper surface side of a substrate to provide a display region;
   an insulation film which is formed to cover the signal lines except for terminal portions of the signal lines in periphery of the substrate; and
   conductive layers which extend in an extension direction of the signal lines to traverse the terminal portions, wherein
   a gap is formed in the insulation film and is shaped rectangular,
   a pair of holes are formed in the signal lines at portions underneath and corresponding to two sides of the gap along the extension direction, and
   each of the conductive layers is formed on the signal lines and between the pair of holes, a part of said each conductive layer is formed on the insulating film, while the insulated film is formed on the signal lines and outside of the pair of holes.

2. A display device according to claim 1, wherein the display region includes gate signal lines and drain signal lines, wherein a material of the signal lines is equal to a material of the gate signal lines, and a material of the conductive layers is equal to a material of the drain signal lines.

3. A display device according to claim 1, wherein gate signal lines, drain signal lines and interlayer insulation films which are formed between the respective signal lines are formed on a display region, and a material of the insulation films is identical with a material of the interlayer insulation film.

4. A display device comprising:
   signal lines which are formed on an upper surface side of a substrate to provide a display region;
   a first insulation film which is formed between the substrate and the signal lines,
   a second insulation film which is formed to cover the signal lines except for terminal portions of the signal lines in periphery of the substrate; and
   conductive layers which extend in the extension direction of the signal lines to traverse the terminal portions, a part of each of the conductive layers is formed on the second insulating film,
   wherein each of the signal lines branches to three along the extended direction to provide a central portion and two side portions, and
   said each conductive layer is formed on the central portion, and the second insulation film is formed on the side portions,
   a pair of holes are formed among the central portion and the two side portions, and the first insulation film are exposed at positions of the holes.

* * * * *